United States Patent [19]
Liu et al.

[11] Patent Number: 5,898,306
[45] Date of Patent: Apr. 27, 1999

[54] SINGLE CIRCUIT LADDER RESONATOR QUADRATURE SURFACE RF COIL

[75] Inventors: Haiying Liu, Minneapolis; Charles L. Truwit, Wayzata, both of Minn.

[73] Assignee: Regents of the University of Minnesota, Minneapolis, Minn.

[21] Appl. No.: 08/838,604

[22] Filed: Apr. 9, 1997

[51] Int. Cl.$^6$ .................................................. G01V 3/00
[52] U.S. Cl. ........................................... 324/322; 324/318
[58] Field of Search ................................... 324/318, 322, 324/300, 314, 312, 307, 309

[56] References Cited

U.S. PATENT DOCUMENTS

| | | | |
|---|---|---|---|
| 4,707,664 | 11/1987 | Fehn et al. | 324/322 |
| 4,721,913 | 1/1988 | Hyde et al. | 324/318 |
| 4,752,738 | 6/1988 | Patrick et al. | 324/318 |
| 4,816,765 | 3/1989 | Boskamp | 324/318 |
| 4,839,594 | 6/1989 | Misic et al. | 324/318 |
| 4,879,516 | 11/1989 | Mehdizadeh et al. | 324/318 |
| 4,881,032 | 11/1989 | Bottomley et al. | 324/309 |
| 4,906,933 | 3/1990 | Keren | 324/318 |
| 4,918,388 | 4/1990 | Mehdizadeh et al. | 324/322 |
| 4,931,734 | 6/1990 | Kemner et al. | 324/318 |
| 4,985,678 | 1/1991 | Gangarosa et al. | 324/318 |
| 5,030,915 | 7/1991 | Boskamp et al. | 324/318 |
| 5,045,792 | 9/1991 | Mehdizadeh | 324/318 |
| 5,144,240 | 9/1992 | Mehdizadeh et al. | 324/318 |
| 5,160,891 | 11/1992 | Keren | 324/318 |
| 5,196,796 | 3/1993 | Misic et al. | 324/322 |
| 5,212,450 | 5/1993 | Murphy-Boesch et al. | 324/322 |
| 5,235,277 | 8/1993 | Wichern | 324/318 |
| 5,280,248 | 1/1994 | Zou et al. | 324/318 |
| 5,285,160 | 2/1994 | Loos et al. | 324/318 |
| 5,365,173 | 11/1994 | Zou et al. | 324/322 |
| 5,374,890 | 12/1994 | Zou et al. | 324/318 |
| 5,394,087 | 2/1995 | Molyneaux | 324/318 |
| 5,430,378 | 7/1995 | Jones | 324/318 |
| 5,521,506 | 5/1996 | Misic et al. | 324/322 |

OTHER PUBLICATIONS

Ballon, D., et al., "A 64 MHz Half–Birdcage Resonator for Clinical Imaging", *J. of Magnetic Resonance*, 90, 131–140, (1990).

Hu, X., et al., "Reduction of Field of View for Dynamic Imaging", *Magnetic Resonance in Medicine*, 31, No. 6, 691–694, (1994).

Mehdizadeh, M., "RF Coils for Magnetic Resonance Imaging", *RF Design*, 29–38, (1991).

Panych, L.P., et al., "A Dynamically Adaptive Imaging Algorithm for Wavelet–Encoded MRI", *Magnetic Resonance in Medicine*, 32, No. 6, 738–746, (1994).

*Primary Examiner*—Louis Arana
*Attorney, Agent, or Firm*—Schwegman, Lundberg, Woessner, and Kluth, P.A.

[57] ABSTRACT

A single-circuit quadrature surface coil is formed from two ladder resonator coils and includes a first mode circuit path for detecting or generating magnetic flux in a vertical axis from a body under investigation and a second mode circuit path for detecting or generating magnetic flux in a parallel axis, with the first mode and second mode currents 90 degrees out of phase. The surface coil, which supports two resonance current modes for quadrature operation on only one single coil conductor structure, provides a high signal-to-noise ratio (SNR) and a good $B_1$ homogeneity over the imaging volume. This coil alone may be used either for both transmitting and receiving RF signals or for detecting RF signals as "receive only." This coil is well suited for imaging the human neck, spine and heart.

17 Claims, 4 Drawing Sheets

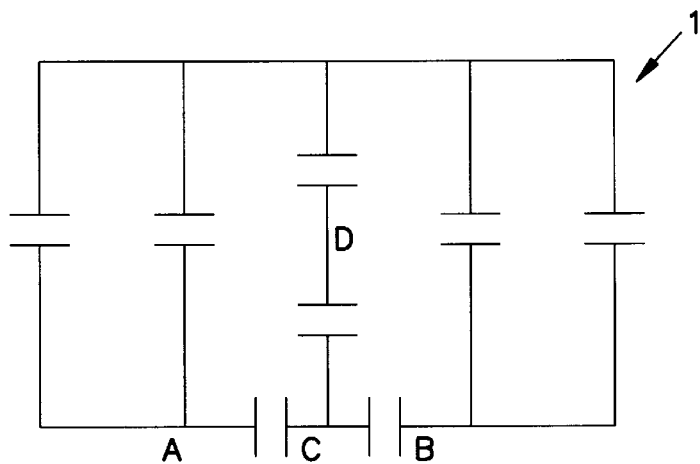
FIG. 1
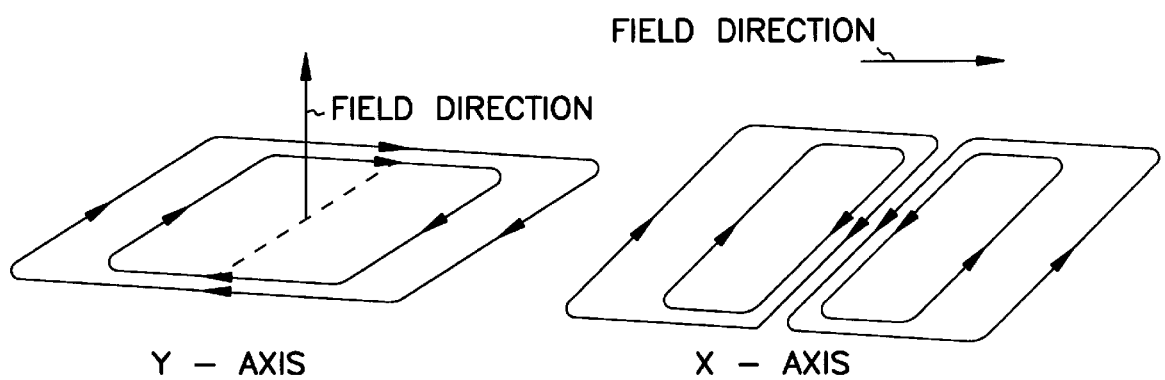
FIG. 2A
FIG. 2B

SINGLE CIRCUIT LADDER RESONATOR QUADRATURE SURFACE RF COIL

TECHNICAL FIELD OF THE INVENTION present invention pertains generally to Magnetic Resonance imaging (MRI) apparatus, and more particularly to a quadrature surface coil for use with MRI apparatus.

BACKGROUND OF THE INVENTION

MRI provides a unique non-invasive imaging method for discriminating the main components of human disease pathology. As a result, MRI is one of the most widely used diagnostic imaging tools in today's hospitals throughout the world. A typical MRI system includes a main magnet to generate a uniform DC magnetic field, three gradient coils to generate linear and orthogonal magnetic field gradients, a transmitting and receiving radio frequency (RF) antenna to generate imaging pulses and receive the resulting RF emissions, and an operator interface and control station. For human imaging the magnet is mainly superconducting in nature and has a cylindrical shape, although at the present time open "C" arm magnet geometries are also used for imaging the human body. For higher strength magnetic fields (0.5 T and higher), the superconducting magnet is used to generate a highly uniform static magnetic field with a clear bore diameter of 90 cm or larger for human patient access.

Gradient coils are electromagnetic coils capable of generating linearly varying and axially directed static magnetic fields along the three spatial directions (x,y,z) of a Cartesian coordinate system. The function of each one of the three orthogonal gradients is to encode the spatial information as a frequency or phase variation. In general, higher gradient strengths of 40–100 mT/m with faster rise times of 40–150 $\mu$sec at full strength are required for faster imaging techniques. Standard methods for production of linear magnetic field gradients in MRI systems consist of driving discrete coils with a current source of limited voltage. The discrete coils are wound in a bunched or distributed fashion on an electrically insulating hollow light cylinder coil-form.

A digital radio frequency transmitter transmits radio frequency pulses or pulse packets to a whole body RF coil to deliver RF pulse into the examination region. The RF pulses are used to excite, prepare, saturate, invert, refocus, or manipulate the resultant bulk magnetization due to ensemble average of the magnetic moment of a specific nuclear spin such as proton in selected portions of the examination region. For whole body applications, the resonance signals are commonly picked up by the same whole body RF coil. For other more regional focused applications, the signals are often picked up by local coils placed at the vicinity of the examination region other than the whole body coil. Alternatively, a receive-only coil can be used to receive resonance signals induced by the body RF coil. For example, in human head imaging, an insertable head coil can be inserted surrounding a human brain at the isocenter of the magnet used for receiving the RF signal. Conventional RF coils for MRI application are the birdcage coil, single loop surface coil and surface array coil.

In MRI, the resultant radio-frequency signals, which are spatially encoded, are picked-up by the receiver RF coil, amplified and then demodulated/digitized by a receiver. A sequence controller controls or schedules the timing sequence of the three orthogonal gradients, RF pulse waveforms, frequency offset, RF phase, data sampling window of the receiver, as well as other events such as triggering to generate a variety of MRI sequences, such as spin echo imaging, gradient echo imaging, fast spin echo imaging, and echo planar imaging. An image reconstruction processor sorts the spatially encoded image data according to the order in which they are received and transforms the data to form the final MR image.

More specifically for RF antenna, a simple conductor loop interrupted with some capacitors of proper values can serve as a local RF antenna that is capable of transmitting RF signal to its vicinity and detecting minute RF signal from its vicinity with a relatively high signal-to-noise ratio (SNR). Such a coil can only transmit and detect one component of the magnetization signal during M imaging, and often is referred as a linear (RF) coil. Since the detectable magnetization for MRI is a two dimensional vector, to improve the SNR and $B_1$ uniformity, a quadrature version which receives two orthogonal components simultaneously was then introduced for the same geometry configuration.

PRIOR ART QUADRATURE RF COILS

Previously, there were some early quadrature surface RF coil designs described by various people including Hyde, et al., U.S. Pat. No. 4,721,913, issued Jan. 26, 1988, and Mehdizadeh, et al., MRM, 1,256,1988, U.S. Pat. No. 4,918, 388, issued Apr. 17, 1990. Both the Hyde and Mehdizadeh designs consist of two separated and isolated coil circuits which simultaneously generate or detect two orthogonal RF polarizations independently. Furthermore, it has been shown that the two circuits can be made mutually decoupled from each other for the respective resonance modes of interests by means of proper geometrical overlapping. The two signals obtained from two orthogonal polarizations can be combined to enhance the SNR in the resulting image using a quadrature combiner. Boskamp et al., in U.S. Pat. No. 5,030,915, issued Jul. 9, 1991, disclose a single circuit quadrature RF coil formed from a pair of parallel mode single loop coils. The Boskamp et al. coil is formed from an annular outer conductor with an inner conductor connected on first and second ends at respective spaced points around the outer conductor.

Another approach to increase both sensitivity and uniformity for a surface coil over a certain coverage was the "half birdcage" design proposed by Ballon et al., JMR, 90, 131–140 (1990). The half birdcage design is also known as a one dimensional ladder resonator. Due to the multiple conductor design of the half birdcage design, it provides better uniformity of field than single loop coils. Although it is an improvement over the single loop design, it is not a quadrature design, lacking the superior SNR of the quadrature RF coils.

Therefore, it would be desirable if the uniformity of coverage of the ladder resonator coil and the superior SNR of the quadrature coil could be attained simultaneously in a single coil structure.

SUMMARY OF THE INVENTION

The present invention provides a ladder resonator quadrature coil having the superior SNR of quadrature coils and the uniformity of ladder resonator coils. According to one embodiment, the coil of the present invention comprises a single-circuit quadrature coil including a pair of tuned ladder resonator coils sharing a common conductor pattern symmetrical about a center conductor path. According to one aspect of the invention, the coil construction provides a first mode circuit path sensitive to magnetic flux in a first orientation, and a second mode circuit path sensitive to magnetic flux in a second orientation orthogonal to the first whereby quadrature operation is obtained. According to another aspect, first and second relatively isolated signals representing orthogonal magnetic fields emitted from a body under investigation in an MRI apparatus are obtainable from the respective first and second mode circuit paths. This embodiment, which supports two resonance current modes for quadrature operation on only one single-coil conductor structure, provides a high signal-to-noise ratio (SNR) and a good $B_1$ homogeneity over the imaging volume. This coil embodiment may be used either for both transmitting and receiving RF signals or for detecting RF signals as "receive only". This embodiment of the invention is also well suited for imaging the human neck, spine and heart.

According to another exemplary embodiment of the invention, the single circuit ladder resonator quadrature coils of the present invention are mounted in combination with a standard birdcage coil to provide additional imaging capability for the neck region of a user having their head positioned in the birdcage coil. According to yet another embodiment, the coils of the present invention are integrated or mounted in combination with other conventional coils to provide supplemental imaging capability.

BRIEF DESCRIPTION OF THE DRAWINGS

In the drawings like numerals refer to like components through several views.

FIG. 1 is a simplified schematic circuit diagram of the single circuit ladder resonator quadrature surface coil according to one embodiment of the present invention.

FIG. 2A and 2B illustrate the current flow patterns for the two resonance modes of the of the exemplary embodiment of FIG. 1.

DETAILED DESCRIPTION OF THE INVENTION

Figure 3:
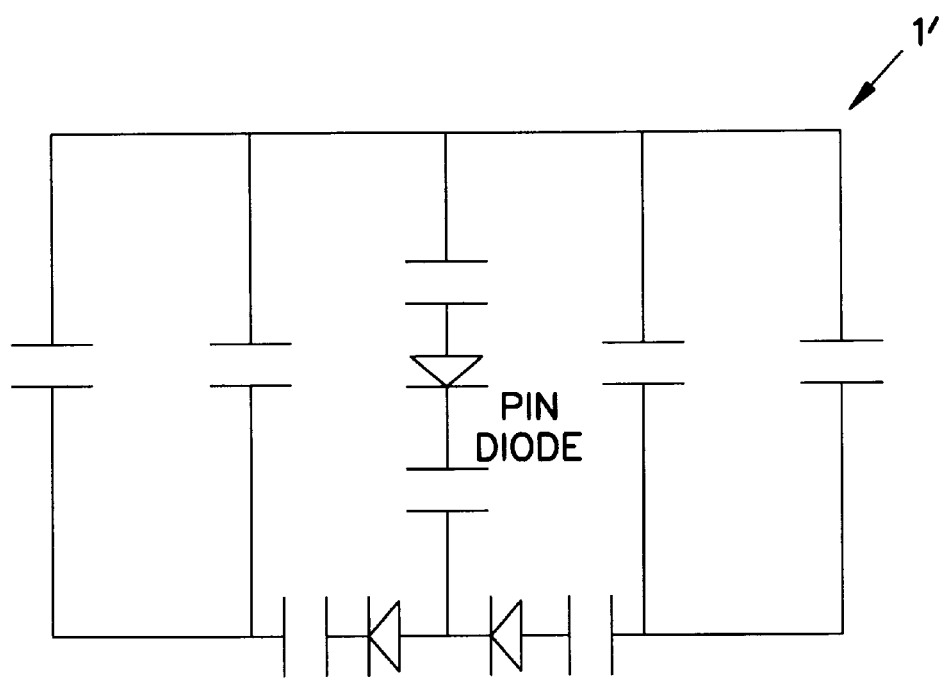
FIGS. 3 and 4 illustrate simplified schematic circuit diagrams of embodiments of the ladder resonator quadrature surface coils of the present invention with circuit elements for decoupling the coils when used in a receive only mode.

In the following detailed description of the preferred embodiments, references made to the accompanying drawings which form a part hereof, and in which is shown by way of illustration specific preferred embodiments in which the invention may be practiced. These embodiments are described in sufficient detail to enable those skilled in the art to practice the invention, and it is to be understood that other embodiments may be utilized and that structural, logical, physical, architectural, and electrical changes may be made without departing from the spirit and scope of the present invention. The following detailed description is, therefore, not to be taken in a limiting sense, and the scope of the present invention is defined only by the appended claims and their equivalents.

The ladder resonator quadrature coil of the present invention combines two separate ladder resonator coils for two polarizations into an integrated coil conductor structure. This new composite coil provides both high SNR and good $B_1$ homogeneity over the imaging volume. The simplified topological structure of an embodiment of the new ladder resonator quadrature coil design of the present invention is shown schematically in FIG. 1. For simplicity, the decoupling circuits for receive only operation, which are required by the standard MRI system to decouple the coil from the whole body coil by detuning the resonance frequency of the coil during RF transmission, are omitted from the illustration of FIG. 1. As shown in the FIG. 1, the ladder resonator quadrature coil embodiment shown therein can be said to be formed of two ladder resonator coils sharing a common conductor pattern which is symmetrical about a center conductor. In the embodiment of FIG. 1, two parallel conductor strips in the horizontal direction are connected by five (5) or more uniformly spaced vertical oriented conductor strips or legs, also referred to herein as "paths." Both horizontal and vertical conductor strips are interrupted by capacitors. The coil structure is symmetric with respect to the center vertical conductor, or circuit path, to provide an annular first mode circuit path using the two (2) or more spaced conductor legs on each side of the center conductor leg. The circulation of current through this path is shown in FIG. 2A, wherein the dotted center line corresponds to the center leg conductor of coil 1. The first mode circuit path detects or generates magnetic flux of a first polarization from a body under investigation. A second mode circuit path including the center circuit path, the current flows for which are shown in FIG. 2B, detects or generates magnetic flux in another plane of polarization, with the currents in the first and second mode circuit paths 90 degrees out of phase.

Electrically the overall coil embodiment 1 is nothing but a simple one dimensional circuit network for current loops. Such a structure supports many resonance current modes (there are four independent modes), whose mode currents share the same conductor pattern. The current patterns shown in FIG. 2A and 2B for these two useful resonance modes of coil 1 are capable of generating fields either vertical (perpendicular) or horizontal (parallel) to the surface of the coil. Although the frequencies corresponding to the two specific modes are often different, in the coils of the present invention these two frequencies are made identical by introducing a set of capacitors cross both center vertical conductor (DC) and one of the two end-ring conductors (AC, CB). In order to accomplish the required frequency matching between two polarizations for quadrature operation, the capacitance of the capacitor on the center vertical conductor is varied or set accordingly. In addition, the values for different capacitor components can be predicted for a given structure using a numerical model for the RF coil. At the resonance frequency, two independent RF signals corresponding to the two orthogonal components of the excited magnetization vector can be taken out simultaneously directly from the coil for the purpose of MRI. One RF signal can be taken out from the center vertical conductor strip or leg through a direct electrical coupling cross the capacitor, and the other can be taken out at the center of one of the parallel conductor strips in similar fashion. For example, U.S. Pat. No. 5,030,915 illustrates in more detail how these signals can be taken off of a single circuit quadrature coil. Furthermore, these two useful resonant modes are intrinsically isolated from each other as a result of their corresponding geometric shapes. Other means of tuning the coils are also possible such as also shown in U.S. Pat. No. 5,030,915, and in particular FIGS. 4, 5 and 6 of that patent.

According to one embodiment of the invention, the conductor pattern of the coil 1 can be constructed on an electrically insulated as well as heat resistant former using copper strips etched or applied to the flexible former. The size of the coil can be made larger or smaller depending on the required coverage of a specific application. The face of the coil can be made to be flat, curved or flexible. Using a construction of this type, approximately –21 db isolation (loaded) between the two polarizations is achievable. The two signals corresponding to two orthogonal polarizations were transmitted independently from the coil through two short flexible 50 ohm coaxial cables to corresponding low noise pre-amplification modules. Then, the amplified signals were fed to a multiple channel port on an MRI apparatus for transmission, demodulation, digitization and image reconstruction. With the decoupling circuits as shown for example in FIG. 3 incorporated in a coil of this construction, the resulting coil in a receive only mode was used for imaging studies at 1.5T on a Siemens Vision™ whole body MRI system. While the coil 1 is illustrated in FIG. 1 as having a rectangular shape, it can be any arbitrary shape that preserves the symmetry necessary for tuned operation, such as the general shapes shown in FIGS. 7a, 7b and 7c of U.S. Pat. No. 5,030,915.

With a proper impedance match circuit the two RF signals obtained from the coil structure of FIGS. 1–4 can be pre-amplified and combined using a standard analog quadrature combiner. Alternatively, for achieving the optimal SNR, the MR signals corresponding to two orthogonal polarizations from the coils can each be separately pre-amplified using a low noise RF amplifier and fed into two RF receiver channels, so the two signals are demodulated and digitized independently. The required quadrature signal combination can be accomplished digitally in the image domain using a software combination accompanied with phase correction for compensating the coil reception phase variation. In addition, the shape and geometrical size of the coils made in accordance with the invention can be optimized for a given application.

Furthermore, ladder resonator quadrature coils made according to the present invention can be used completely alone for both transmitting and receiving RF signal as a transmit-receive (T/R) coil for MR imaging and spectroscopy. Using this design, the traditional half-birdcage coil can be modified to be operated in quadrature mode. One of the advantages of the T/R coil design is its relatively simple coil structure, since it does not require decoupling components on the coil; another advantage is the 40% improvement in SNR over conventional birdcage coils.

Figure 4:
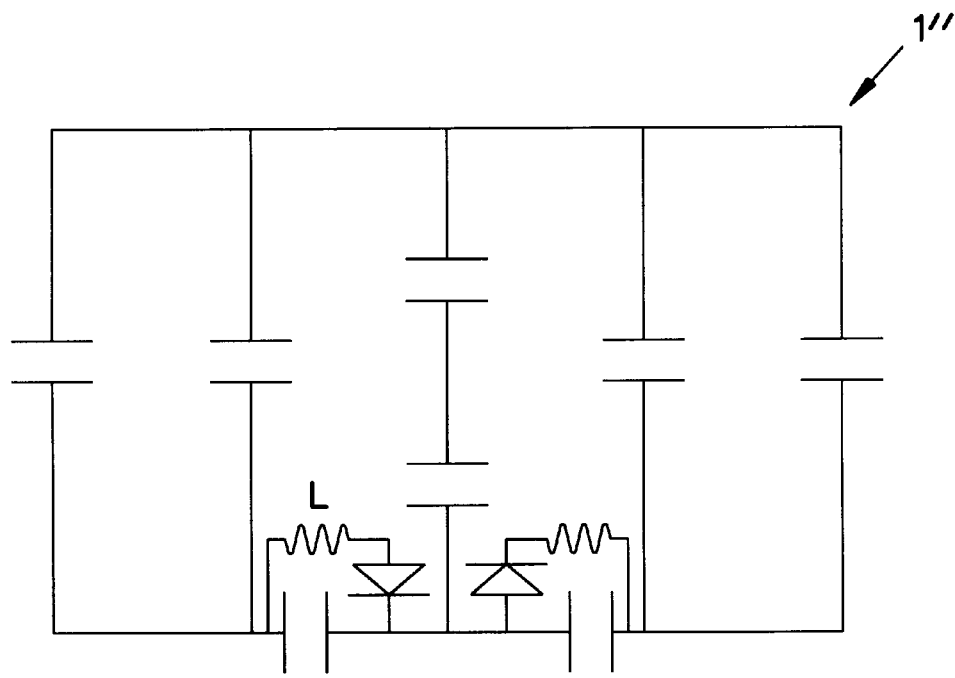

If a ladder resonator coil made in accordance with the invention is used in a receive-only operational mode, the coil needs to be made invisible to the transmit RF coil during RF power transmit by means of detuning the resonance frequency of the receiver coil away from that of the transmitter coil, which may be a saddle coil or full birdcage coil by way of example. There are various possible approaches suitable for this detuning. Using a few PIN diodes and inductors in proper locations on the coil 1 structure, the resonant frequencies for the two useful modes of coil can be detuned by selectively switching these diodes on or off using an externally applied voltage signal across these diodes. Examples of coils 1' and 1" modified for this purpose are shown in FIGS. 3 and 4. In FIG. 4, tank circuits activated with the PIN diodes are used to detune the circuit, while in the embodiment of FIG. 3, PIN diodes alone are employed. Of course, many other configurations of circuit elements and position can be used to detune the coil, and the examples given herein are not to be construed as limiting.

Figure 5:
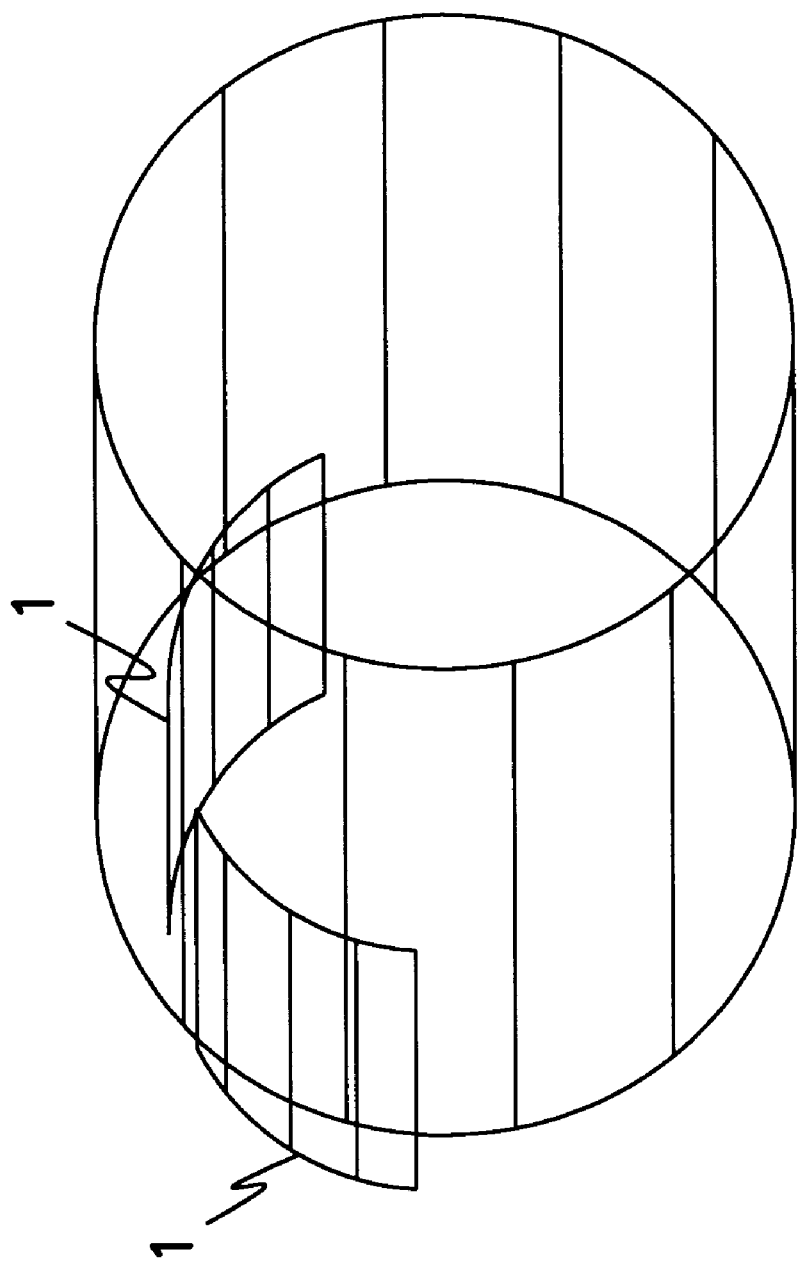
FIG. 5 illustrates a pair of ladder resonator quadrature surface coils of the present invention mounted in combination with a birdcage coil.

For many practical applications, ladder resonator quadrature surface coils 1 (or 1' or 1") can be integrated into or mounted in combination with many other conventional coils available on clinical MRI systems, one of which is a standard birdcage head coil 2 as shown in simplified form in FIG. 5. Such an "integrated" coil set is highly desirable for head-neck imaging applications. This allows the possibility of performing a complete head-neck examination without changing the RF coil in the middle of examination. The different elements can be selectively switched on and off (i.e. detuned) by the means of a DC voltage signal applied to the coils externally. In FIG. 5 coils 1 (or 1' or 1") are shown mounted or integrated with the full birdcage coil 2. Mounting or integration can be accomplished by mechanically or otherwise fixing the location of the coils 1 in relation to the birdcage coil 2 so that, in this case, when a patient's head is positioned in the birdcage coil, their neck is positioned in the sensitive region of the coils 1. By constructing the ladder resonator coils with input and output leads compatible with existing MRI systems, these coils can be made to work with such existing systems, and mounted to work in conjunction with conventional full birdcage coils of various types or manufacture, or in conjunction with other imaging coils commonly used with MRI systems.

Figure 6:
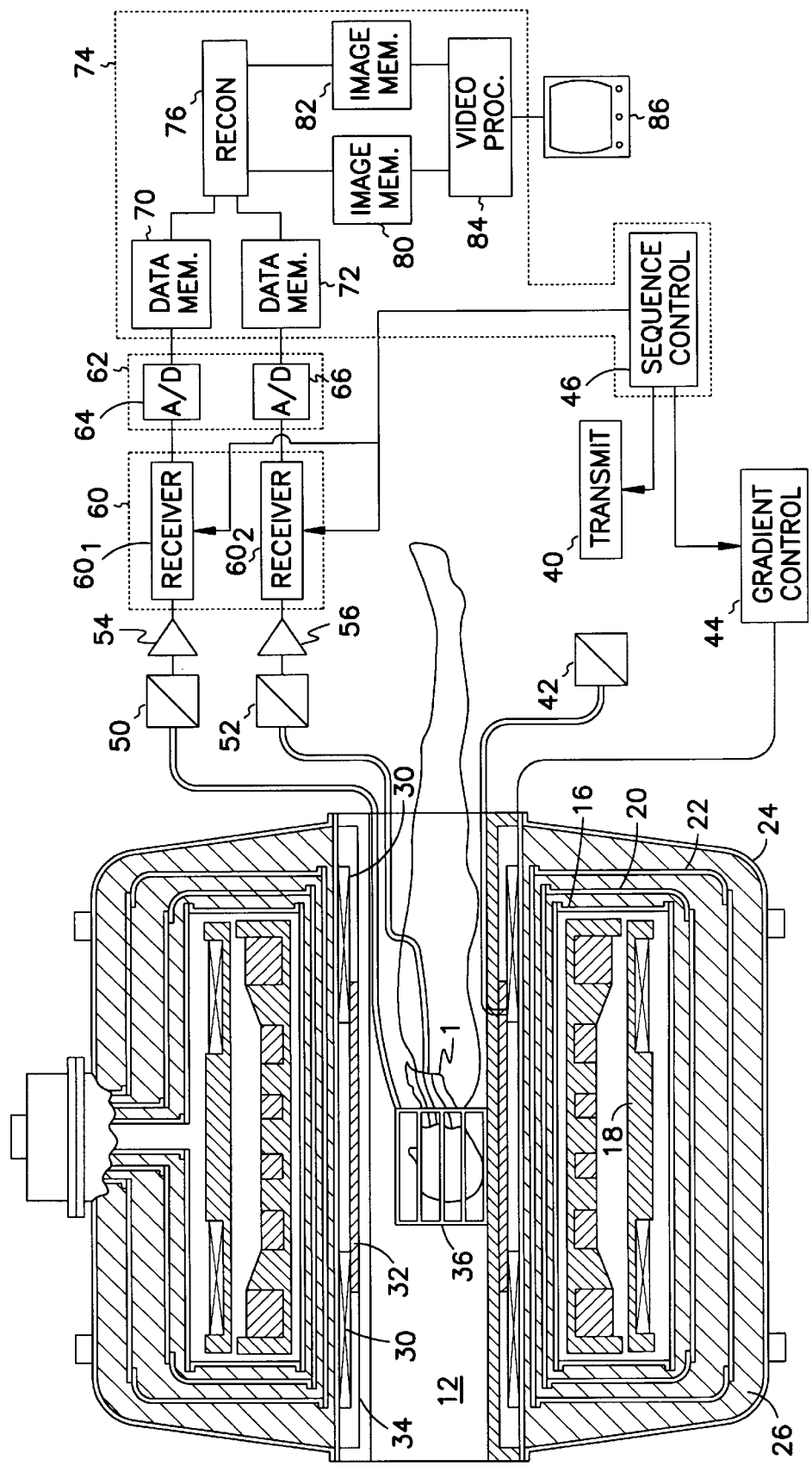
FIG. 6 illustrates the coils of FIG. 5 deployed in an MRI apparatus.

FIG. 6 illustrates the use of the coils of the present invention as shown in FIG. 5 when deployed in an MRI apparatus. The MRI apparatus shown in FIG. 6 includes a plurality of superconducting main magnetic field coils 10 to generate a generally uniform static magnetic field along a longitudinal or z-axis of a central bore 12. The superconducting coils are mounted on a dielectric former 14 and received in an annular, helium vessel 16. The helium vessel is filled with liquid helium to maintain the superconducting magnets at their superconducting temperature. A main magnetic field shield coil assembly 18 generates a magnetic field which opposes the fields generated by the main magnets 10 in regions surrounding the superconducting magnets 10. The annular helium reservoir 16 is surrounded by a first cold shield 20 which is maintained at about 20° K. or less. A second cold shield assembly 22 is chilled to about 60°–70° K. or less. An outer vacuum vessel 24 encases the cold shields to define a vacuum reservoir therearound. Layers of mylar insulation 26 are arranged between the vacuum vessel 24 and the cold shield 22.

A circularly cylindrical, whole body gradient coil assembly 30 is mounted on a circularly cylindrical dielectric former and mounted within the bore 12. A circularly cylindrical, whole body RF coil 32 is mounted on a circularly cylindrical dielectric former and mounted within the bore 12. A circularly cylindrical dielectric cosmetic sleeve 34 shields the RF and gradient coils from view and protects them from damage. The ladder resonator quadrature coil/birdcage head coil combination shown in FIG. 5 is positioned in bore 12 in close proximity to the patient. As illustrated, the ladder resonator quadrature coils 1 (or 1' or 1") and the birdcage coil 36 (in this case a quadrature birdcage coil) each include separate circuits connecting them to the transmitter and receivers. Only one ladder resonator quadrature coil is shown in FIG. 6, but preferably a second is provided on the other side of the patient's neck as shown in FIG. 5, and an additional circuit is provide to transmit and receive RF from the other coil. Alternatively, a switch could be provided to switch between the leads from the two ladder resonator quadrature coils so that only one set of transmit and receive circuits would be needed.

A transmitter 40 is connected with the whole body RF coil 32 for transmitting resonance excitation and manipulation pulses thereto. Preferably, a quadrature divider 42 splits the radio frequency signal into two components and phase shifts one component 90° relative to the other. The two components are applied in quadrature to the whole body RF coil.

A gradient control means 44 is connected with the gradient magnetic field coils 30 for providing current pulses thereto for generating magnetic gradient pulses across the examination region. A sequence control means controls the radio frequency transmitter 40 and the gradient control means 44 to generate conventional resonance excitation sequences such as spin echo, gradient echo, field echo, sequences and the like. Preferably, resonance is excited in two preselected planes or slabs by applying a linear z-gradient field concurrently with a tailored radio frequency excitation pulse for exciting resonance in the two or more preselected slices or slabs. Preferably, one of the slices or slabs intersects the region examined by each of the surface coils 1 (or 1' or 1") and 38.

The radio frequency transmitter 40 and the gradient control 44 under the control of the sequence control 46 elicit simultaneous magnetic resonance responses in planes or slabs through each of the quadrature surface coils 1 (or 1' or 1") and 38. The signals from the two quadrature surface coils are conveyed to a pair of quadrature combiners 50, 52. The quadrature combiners impose a 90° phase shift on one of the detected quadrature components and combine the components. Preamplifiers 54, 56 amplify the signals before they are received by a receiver means 60, such as a pair of digital quadrature receivers $60_1$, $60_2$, which receive and demodulate the resonance signals. An interface circuit 62 includes analog-to-digital converters 64, 66 for digitizing each received resonance signal to generate a digital data line.

The digital data lines are stored in data memories 70, 72 of a computer means 74. An image reconstruction means such as an inverse two-dimensional Fourier transform means 76 reconstructs sets of data lines from the data memories 70, 72 into electronic digital image representations which are stored in image memories 80, 82. A video processor means 84 converts the digital image representations into the appropriate video format for display on a video monitor 86 or other human-readable display.

Those of skill in the art will recognize that the conductors of the ladder network of the birdcage coil 38 and quadrature coil 1 must be oriented in parallel with the uniform magnetic field, such that use of the coil system with different orientations of the uniform, main field requires reorientation of the coils to meet this requirement.

When the coils of the present invention are used for receiving in the embodiment or arrangement shown in FIGS. 3 and 4, the coil advantageously improves SNR by more closely allowing the correlation of the geometric location of the transmit pulses with the corresponding RF emissions detected by the coils. Furthermore, according to another embodiment, a sensor is provided to detect the pulse in the carotid artery, so that the imaging pulses can be synchronized or triggered on pulse events, and thereby provide repeatable, consistent imaging.

As suggested above, ladder resonator quadrature coils constructed according to the present invention can be of a substantially planar configuration in the manner of a surface coil, or shaped or curved to provide a half-birdcage coil configuration, providing a single half-birdcage coil structure operable in a quadrature mode. In terms of clinical imaging application, coils constructed according to the present invention are well suited for imaging the human neck, spine and heart. For multi-nuclear spectroscopy applications, such coils can be easily made double tuned for simultaneously observing two frequencies.

In the invention disclosure, for simplicity and the purpose of description, the ladder resonator quadrature coil embodiments are shown with five legs, but the number of legs is arbitrary, and can be more than five. However, the term "ladder resonator quadrature coil" as used herein requires that each respective coil on either side of the circuit include multiple legs or "vertical" conductors, such that each respective coil itself forms a ladder. This structure distinguishes the design of the present invention from that of U.S. Pat. No. 5,030,915, wherein the respective sides of the single circuit quadrature coil are single loop coils. Thus, while it is required that the ladder resonator quadrature coil of the present invention include multiple legs on each side, the number of legs as noted may be greater, such as 7, 9, 11 etc. Alternatively, the number of legs may be even. In the case of even numbers of leg conductors, the center circuit path is formed from two (or more) conductors used as an effective center leg. Furthermore, the spacings between vertical legs or conductor strips can be varied symmetrically with respect to the center strip.

Further possible modifications to the invention include placing the capacitors on the other end-ring to preserve symmetry. Also, as is well known, inductive coupling can be used for feeding and taking signals out from the coil, or the orthogonal signals can be combined using a standard quadrature hybrid combiner before or after preamplification. It is also possible that the two orthogonal modes of the coil can be intentionally tuned to two different frequencies, providing a double tuned coil for multi-frequency or multi-nuclear imaging or spectroscopy.

In addition to the above noted variations in coil design, coils constructed according to the present invention can be made to conform to the geometry of the anatomy using curved (non-straight) vertical and horizontal conductors, or be made to have more open space for the interventional purpose as well as conventional imaging. Furthermore, two or more small coils can be integrated into a ladder resonator quadrature coil of the present invention for active position and orientation tracking. Moreover, the design concepts of the present invention can be applied to improve many existing MRI surface or wrap-around surface coils for imaging of other parts of human body. Also, although described with respect to imaging the human body, the coils of the present invention can be used to image any animal or other body, and the term "body" or "patient" as used herein should not be interpreted as limited to a human body or patient.

Thus, as described above ladder resonance quadrature coils constructed according to the present invention provide the superior SNR of quadrature coils with the uniformity of field obtainable with ladder resonance coils, in a single circuit design easy to construct and use. As used herein, the term "single-circuit" refers to a circuit connected together with physical electrical components or equivalents of physical components, as opposed to the independent coil designs of prior art quadrature coil systems wherein the coils are formed separately from one another. It should also be noted that many different embodiments of the coil of the present invention are possible, and in particular that the type and placement of the circuit elements necessary for tuning, detuning and quadrature operation can be varied considerably and still achieve the desired operation, as known to those of skill in the art. Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is intended that this invention be limited only by the claims and the equivalents thereof.

What is claimed is:

1. A radio frequency (RF) coil construction, comprising a single-circuit quadrature coil including a pair of tuned ladder resonator coils sharing a common conductor pattern symmetrical about a center conductor path.

2. A coil construction according to claim 1 further wherein each ladder resonator coil has two or more conductor paths, in addition to the center conductor path, forming "rungs" of the ladder.

3. A coil construction according to claim 1 wherein a first mode circuit path is sensitive to magnetic flux in a first orientation, and a second mode circuit path is sensitive to magnetic flux in a second orientation orthogonal to the first whereby quadrature operation is obtained.

4. A coil construction according to claim 3 wherein first and second relatively isolated signals representing orthogonal magnetic fields emitted from a body under investigation in an MRI apparatus are obtainable from the respective first and second mode circuit paths.

5. A coil construction according to claim 1 wherein the center conductor path is formed with two or more individual conductors.

6. A coil construction according to claim 1 further including means for detuning the coil temporarily whereby interference with an externally generated RF field is avoided.

7. A coil construction according to claim 1 wherein the coil includes PIN diodes or tank circuits used to detune the coil.

8. A coil construction according to claim 1 further wherein the coil is curved to optimize its use with a body under investigation.

9. A coil construction according to claim 1 further wherein the coil has a half-birdcage shape.

10. A radio frequency (RF) coil construction, comprising a pair of first tuned ladder resonator coils each having two or more conductor paths in addition to a shared center conductor path, the ladder resonator coils sharing a common conductor pattern and symmetrical about the center circuit path, said construction providing a first mode circuit path formed to include the conductor paths of each of the ladder resonator coils, the first mode circuit path defining a second coil, the construction including means for tuning the first and second coils to a given RF and means for causing said first and second coils to operate in quadrature and generate first and second relatively isolated signals manifesting said orthogonal magnetic fields in said body.

11. A method of forming a single-circuit quadrature radio frequency (RF) coil, comprising the steps of a) combining a pair of first tuned ladder resonator coils to provide a common conductor pattern and so that they are symmetrical about a center conductor path, and b) adding to the combined coils elements for forming first and second coils each respectively responsive in quadrature mode operation to magnetic fields orthogonal to one another.

12. An integrated radio frequency (RF) coil system comprising a single-circuit quadrature coil including a pair of tuned ladder resonator coils sharing a common conductor pattern symmetrical about a center conductor path fixed in position relative to another coil of a different design, so that the quadrature coil and the coil of a different design can be alternately used when imaging a body under investigation.

13. A coil system according to claim 12 wherein the coil of a different design is a full birdcage coil and the quadrature coil is positioned to have a sensitive region for imaging a neck of a patient whose head is positioned in the full birdcage coil.

14. A method of MRI imaging a patient's neck comprising the step of positioning the patient's head in the birdcage coil of claim 13, and using either the birdcage coil or the quadrature coil for imaging operations.

15. An MRI apparatus comprising a magnet system for generating a steady, uniform magnetic field, a magnet system for generating magnetic gradient fields, a transmit RF coil for generating a RF magnetic alternating field and a surface coil comprising a single-circuit quadrature coil including a pair of tuned ladder resonator coils sharing a common conductor pattern symmetrical about a center conductor path.

16. A method for imaging the head, neck or heart of a patient comprising the step of positioning the coil of claim 1 adjacent thereto and using the quadrature coil in combination with an MRI apparatus to image the same.

17. A coil construction according to claim 1 further including a sensor for detecting the pulse of a patient under investigation, wherein the sensor is mechanically mounted in relation to the quadrature coil so that the pulse is obtained proximate the location of the coil when positioned adjacent the patient.

* * * * *

UNITED STATES PATENT AND TRADEMARK OFFICE
CERTIFICATE OF CORRECTION

PATENT NO. : 5,898,306
DATED : Apr. 27, 1999
INVENTOR(S) : Liu et al.

It is certified that error appears in the above-identified patent and that said Letters Patent is hereby corrected as shown below:

Drawings:
In Fig. 2A, please reverse the direction of the field direction arrow, making arrow indicator show downward movement.

In Fig. 2B, please reverse direction of the field direction arrow, making arrow indicator show direction to the left.

Signed and Sealed this

Eleventh Day of January, 2000

Attest:

Q. TODD DICKINSON

*Attesting Officer*     *Acting Commissioner of Patents and Trademarks*